Jan. 24, 1967 W. F. GABRIEL 3,300,730

NEGATIVE RESISTANCE AMPLIFIER

Filed Sept. 3, 1963

INVENTOR

William F. Gabriel

BY

Glenn S. Quick

AGENT

United States Patent Office 3,300,730
Patented Jan. 24, 1967

3,300,730

NEGATIVE RESISTANCE AMPLIFIER

William F. Gabriel, Annandale, Va., assignor to Keltec Industries, Inc.

Filed Sept. 3, 1963, Ser. No. 306,178
1 Claim. (Cl. 330—61)

This invention relates in general to semiconductor amplifiers and in particular to semiconductor amplifiers of the negative resistance variety.

Negative resistance amplifiers wherein an input signal is applied via a selected port, is amplified, and then is reflected back via the same port are well-known and have enjoyed widespread application in microwave receiver devices, especially. In transponders, for example, negative resistance amplifiers of this variety have been utilized in conjunction with directional couplers to initiate a transmission upon receipt of a selected wave energy signal. Likewise, single port negative resistance amplifiers have been utilized without directional couplers to trigger various devices having an input signal threshold substantially greater than the level of the received wave energy signal.

It is frequently necessary to provide means for reducing the bandwidth in conjunction with negative resistance amplifiers since negative resistance elements are inherently broadband. This presents a significant impedance matching problem and it has been the practice in the past to alleviate this problem by the introduction of nonreciprocal directional coupler means, such as a balanced four-port microwave circulator, which effectively isolates the input from the output. This permits the simple introduction of conventional narrow band filter means without a critical matching requirement. Unfortunately, this solution to the problem inherently compounds the size, weight and cost factors and thus is not desirable in many applications wherein these factors are of paramount importance.

Accordingly:

It is an object of this invention to provide an improved negative resistance amplifier which is readily adaptable to selected utilization means without a critical impedance matching requirement.

It is also an object of this invention to provide an improved negative resistance amplifier device having a relatively narrow band frequency response.

It is another object of this invention to provide an improved negative resistance amplifier device for use at microwave frequencies which may be directly incorporated in either waveguide or coaxial line systems.

It is still another object of this invention to provide an improved negative resistance amplifier device which may be manufactured by simple casting or milling techniques.

It is a further object of this invention to provide an improved negative resistance amplifier which is adaptable to other than microwave applications.

Other objects of this invention will become apparent upon a more comprehensive understanding of the invention for which reference is had to the following specification and drawings wherein.

Briefly, the device of this invention embodies a negative resistance element, a directional filter and two impedance load means such that the single input port and the negative resistance element are each matched and the wave energy incident on the negative resistance element is within a selected frequency band.

Figure 1:
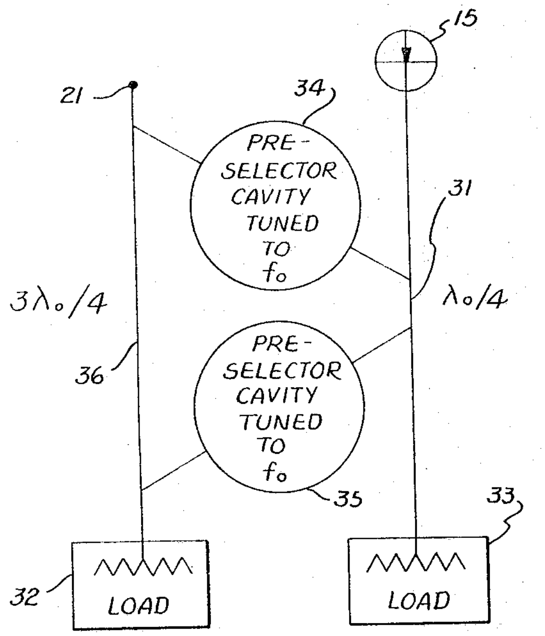
FIGURE 1 is a schematic showing of one embodiment of a negative resistance amplifier in accordance with the present invention.

In FIGURE 1, the input-output port 21 and the load impedance 32 are matched across a ¾λ transmission line 36, where λ is the wavelength at the operating frequency, and the negative resistance element 15 and the load impedance 33 are matched across a ¼λ transmission line 31, λ being the wavelength at the desired frequency $f_o$. The preselector filter means 34 and 35, each tuned to $f_o$, interconnect transmission lines 36 and 31 such that a signal applied to port 21 is passed via filter means 34 and via transmission line 36, filter means 35 and transmission line 31 to arrive at the negative resistance element in phase. Upon amplification by the element 15, which in the case of a tunnel diode may provide a 15 db gain, the signal returns in phase via the same paths to port 21.

By this circuitry, the broadband negative resistance element 15 is only subject to frequencies within a narrow band as determined by the characteristics of the filter means 34 and 35. It will be appreciated that a wide variety of tuned circuit means may be employed as the filter means 34 and 35, for example, a simple parallel inductance-capacitance tank circuit or a more refined cavity device having inherent capacitive and inductive characteristics may be utilized to pass a selected narrow band at the operating frequency. It is important, however, that the filter means 34 and 35 be substantially identical in effect on the signal both before and after amplification. Consequently, it is generally advisable that structurally identical filter means be employed and in the event the filter means are variable, each should be varied in comparable manner to insure the desired balance condition.

Figure 2:
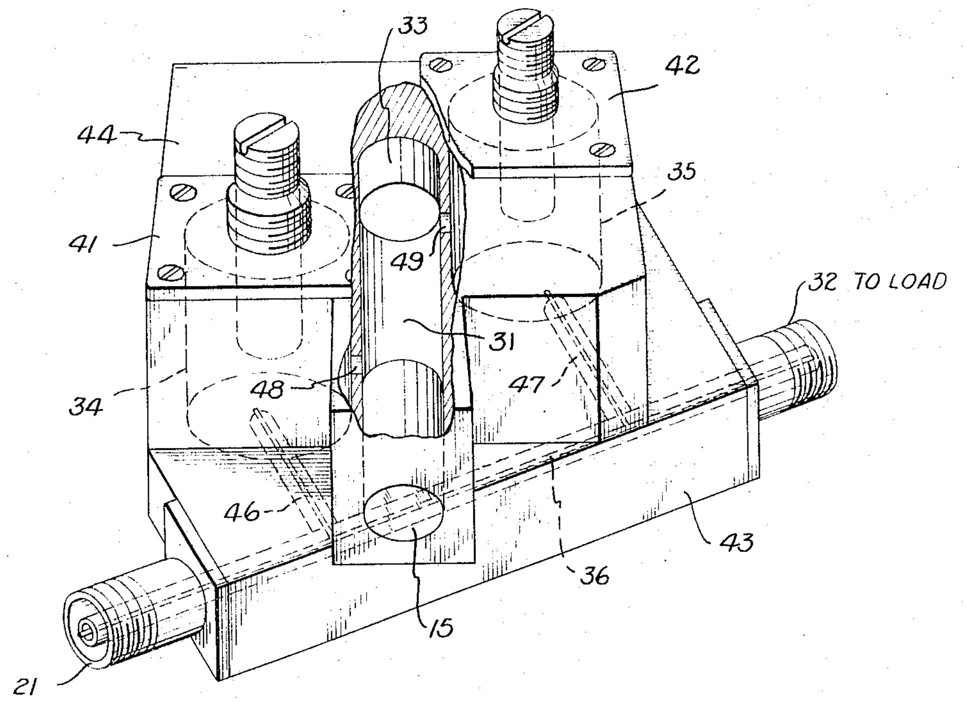
FIGURE 2 is a pictorial showing of a negative resistance amplifier device which is particularly useful in microwave applications.

FIGURE 2 depicts a compact embodiment of the negative resistance amplifier of this invention for use at microwave frequencies. In this embodiment the filter means 34 and 35 are of the cavity variety, the transmission line 36 is a coaxial line section and the transmission line 31 is a waveguide section. In this case, the cavity filter means 34 and 35 and the transmission lines 31 and 36 are coadjacently disposed such that one transmission line is alongside the cavities, the other is intermediate the cavities and the two transmission lines cross. Each transponder line includes terminal connection to each cavity, and these terminal connections are spaced ¼λ and ¾λ respectively in the two transmission lines 31 and 36 in accordance with the operational requirement set forth above in the description of the embodiment of FIGURE 1. In this microwave embodiment the transmission line 31, which is a hollow waveguide section, is disposed intermediate the cavities and the transmission line 36, which is a coaxial line section, is disposed alongside the cavities with ¼λ and ¾λ. It will be appreciated, of course, it is not essential that two different types of transmission line be employed and that if they are different, it is not critical that they be as shown.

It has been found, however, that the particular embodiment shown in FIGURE 2 affords innumerable advantages in terms of compact design, simplified manufacture, cavity coupling, and bandpass control which are in addition to the notable cost and reliability advantages of the invention. To illustrate, the embodiment of FIGURE 2 is readily adaptable to either casting and machining or pure machining manufacturing techniques with no more than three cover plates, the cavity top sections 41 and 42 and the coaxial side plate 43. It will be appreciated that the coaxial side plate 43 may be sectioned from the main block section 44 in a plane through the diameter of the center conductor to expose the area in which the center conductor and its surrounding insulator are situated. Further, it will be seen that the terminal connections associated with the coaxial transmission line section 36 constitute center conductor T sections 46 and 47 which extend into the cavities 34 and 35, respectively, and that the terminal connections associated with the hollow waveguide transmission line 31 constitutes open ports 48 and 49, respectively.

In this embodiment the cavity top sections 41 and 42 incorporate threaded dielectric rod sections 51 and 52, respectively, which may be controllably extended into the cavity. It is not essential, of course, that dielectric rod sections be used to change the electrical characteristics of the cavity, nor is it critical that the variable control be associated with the top sections of the cavity. It has been found, however, that it is particularly desirable to incorporate threaded dielectric rods in the top section in that the discontinuity may be introduced into the cavity along the axis thereof. In this manner a readily predictable linear control is obtained.

The embodiment of FIGURE 2 incorporates the negative resistance element 15, the load impedance 33, the terminal 21, in this instance a coaxial connector, and the load impedance 32 (by means of another coaxial connector) as set forth in the discussion of the schematic showing of FIGURE 1.

It will be seen that the embodiment of FIGURE 2 provides the identical cavity and identical cavity control features which are preferred in the device of this invention. As an added advantage, this identical aspect of the device enables the manufacture of just one cavity top section item and thus minimizes production costs to a considerable degree.

In addition, the embodiment of FIGURE 2 inherently affords an ideal impedance matching arrangement whereby the device may be tuned for selected frequency operation utilizing high precision frequency sources and freely installed in operational equipment, as required, without further adjustment.

It will be appreciated that the main block section 44 may be of any electrically conductive material such as brass, aluminum, or the like, but that it is not essential that the block section be constructed of an electrically conductive material. For purposes of illustration, a solid metallic block section is shown in the exemplary embodiment of FIGURE 2. However, it is within the purview of this disclosure to divide the block section 44 into as many subsections as desired. Also, it is within the purview of this disclosure to utilize a plastic nonconductive block section with a metallic coating applied to all surfaces which necessitate same in this invention.

It will be appreciated that the device of this invention is operable at other than microwave frequencies. Accordingly, the claim appended hereto is to be construed and interpreted in the broadest sense, frequencywise. That is, terms common to the microwave art, such as "port," are not to be considered as restricting the invention to microwave devices. In this instance, for example, the term "port" is intended to describe not only microwave structure but also all comparable input and/or output structure and the like including all appropriate two terminal means across which an input signal may be applied or an output signal may be taken.

What is claimed is:

A narrow band negative resistance amplifier circuit for operation within a frequency range centered about a selected center frequency $f_o$ comprising a coaxial transmission line, input means connected to one end of said coaxial transmission line, first load impedance means connected to the other end of said coaxial transmission line, a hollow waveguide transmission line, a tunnel waveguide transmission line, a tunnel diode negative resistance amplifier device connected to one end of said hollow waveguide transmission line, second load impedance means connected to the other end of said hollow waveguide transmission line, first resonant cavity means tunable for operation at frequency $f_o$ having a wall electrically connected in common with said hollow waveguide transmission means, first dielectric tuning means threadedly mounted in said first resonant cavity means for movement along an axis of said cavity, second resonant cavity means tunable for operation at frequency $f_o$ having a wall electrically connected in common with said hollow waveguide transmission means, second dielectric tuning means threadedly mounted in said second resonant cavity means for movement along an axis of said cavity, means coupling said first and second resonant cavity means to said coaxial transmission line at points separated by $n3\lambda/4$, where $n$ is an integer and $\lambda$ is the wavelength at $f_o$, and means coupling said first and second resonant cavity means to said hollow waveguide transmission line at points separated by $n\lambda/4$, said first and second resonant cavity means and said hollow waveguide transmission line being formed from a single hollowed block structure.

References Cited by the Examiner

UNITED STATES PATENTS 3,208,003 9/1965 Sterzer ---------------- 330—61

ROY LAKE, *Primary Examiner.*

NATHAN KAUFMAN, *Assistant Examiner.*